United States Patent [19]

Fauvet et al.

[11] Patent Number: 4,638,419
[45] Date of Patent: Jan. 20, 1987

[54] PROCESS AND DEVICE FOR DETERMINING THE MEAN VALUE OF THE CURRENT DELIVERED BY A CONTROLLABLE VALVE RECTIFIER BRIDGE

[75] Inventors: Jean-Pierre Fauvet, Rueil Malmaison; Jacques Parisel, Maisons Laffitte, both of France

[73] Assignee: La Telemecanique Electrique, France

[21] Appl. No.: 756,550

[22] Filed: Jul. 19, 1985

[30] Foreign Application Priority Data

Aug. 3, 1984 [FR] France ................................ 84 12321

[51] Int. Cl.⁴ ............................................. H02M 7/04
[52] U.S. Cl. ...................................... 363/87; 363/129
[58] Field of Search .................... 363/85, 87, 128, 129

[56] References Cited

U.S. PATENT DOCUMENTS 4,282,570 8/1981 Kurosawa et al. .................. 363/87

Primary Examiner—Patrick R. Salce
Assistant Examiner—Anita M. Ault
Attorney, Agent, or Firm—William A. Drucker

[57] ABSTRACT

A process and device are provided for determining the mean value of the current delivered by a thyristor rectifier bridge fed by a multiphase AC network. Said device comprises successively an operational amplifier whose inverting input receives a signal representative of the current supplied by the bridge and is connected to its output by a capacitor, a blocking sampler and an analog-digital converter. The switch and the blocking sampler are controlled by a microprocessor so as to obtain an integration cycle and end of cycle sampling during a period zone of value (T/6), (T) being the period of the network.

2 Claims, 10 Drawing Figures

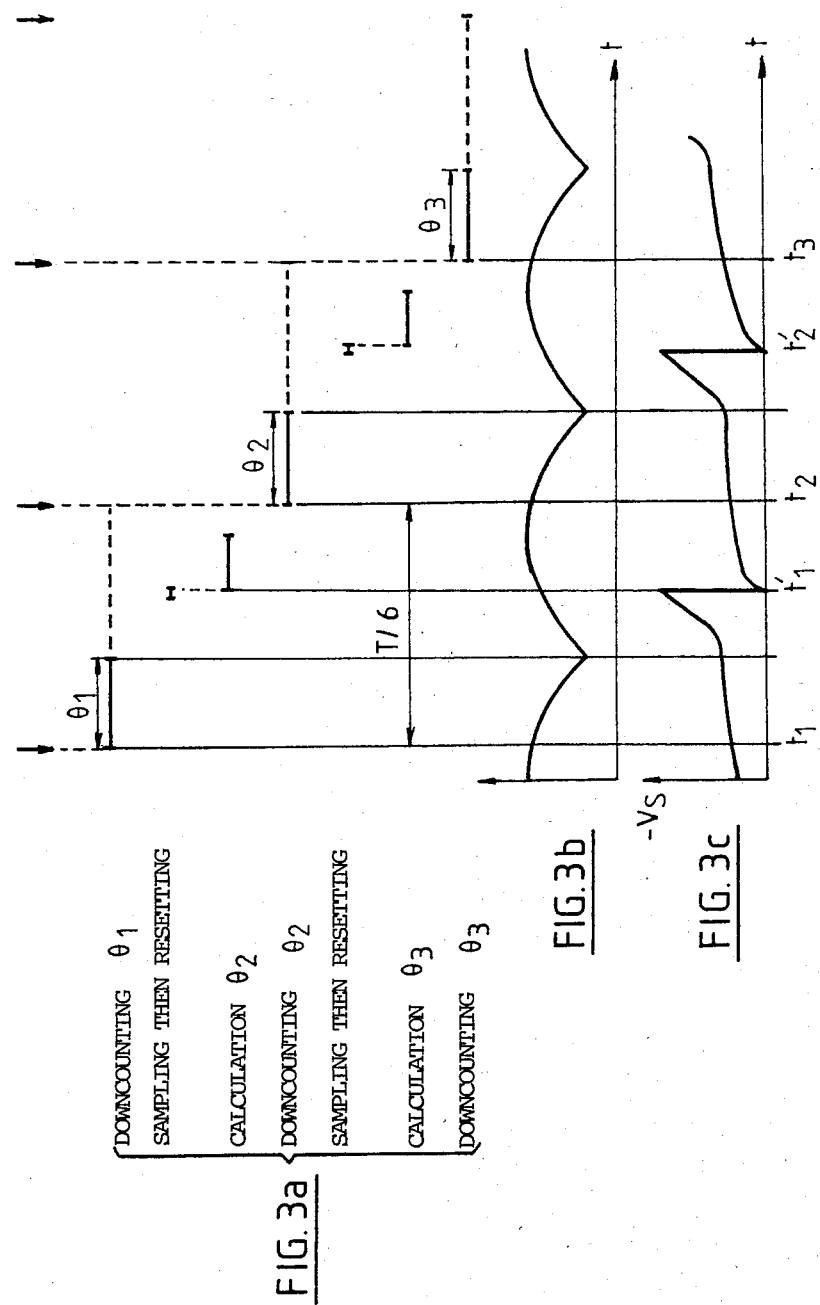

PROCESS AND DEVICE FOR DETERMINING THE MEAN VALUE OF THE CURRENT DELIVERED BY A CONTROLLABLE VALVE RECTIFIER BRIDGE

BACKGROUND OF THE INVENTION

1. Field of the Invention

The present invention relates to a process and device for determining the mean value of the current delivered by a controllable valve rectifier bridge.

It applies more especially but not exclusively to the servo-control of an electronic speed variator for a DC motor using a controllable valve rectifier circuit, for example a thyristor power bridge, of the Graetz circuit type fed with a multi-phase current.

2. Description of the Prior Art

It is known that in a three phase current variator of this kind, the rectifier circuit is usually formed of a bridge comprising three thyristor pairs connected in the following way:

- the two thyristors of the same pair are connected in series in the same direction,
- the junction point between the two thyristors of the same pair is connected to a corresponding phase of the three phase network,
- the two free ends of the thyristors of the same pair are connected respectively to the two supply terminals of the motor.

This circuit should further comprise a means for successively switching on the thyristor pairs of the bridge in synchronism with the zero cross-overs of the compound voltages of the mains, but with a certain phase-shift $\phi$ with respect to the rectifier positive cross-over points and, consequently, detectable with respect to the zero cross-over times of the phase voltages of the network (the rectifier positive cross-over point corresponding to the point of positive equality, at the same time, of two successive phase voltages of the network). Adjustment of the output voltage of the rectifier is then obtained by varying this phase shift $\phi$.

Furthermore, the current delivered at the output of the thyristor rectifier is formed by a succession of curves passing from one to the other in synchronism with the zero cross-over of the phase voltages of the network but with said phase shift $\phi$. This is why, in numerous applications, it is not the instantaneous value of this current which is used, which is not significant because of its variations, but the mean value of this current.

According to the technique used at present, this mean value of the current is obtained by appropriate filtering. However, it has proved that this process is not suitable in the case of regulating a digital electronic speed variator because of the considerable delay which it introduces into the servo-control feedback loop.

The invention provides then a process for determining the mean value of the current delivered by a thyristor rectifier bridge, which does not comprise this drawback.

SUMMARY OF THE INVENTION

This process comprises more particularly the following steps:

- successive integration, by means of a synchronous integrator, of a signal representative of the current supplied by the rectifier, each integration cycle having a duration equal to the period of the synchronization signal but being possibly phase shifted with respect thereto;
- sampling, at the end of each integration cycle, of the integrated signal obtained;
- temporary storage of the sampled signal (blocking); resetting of the synchronous integrator after each sampling;
- the analog-digital conversion of each of the sampled signals stored.

Of course, the signal representative of the current delivered by the rectifier bridge may be taken either downstream or upstream of said bridge. In this latter case, the most usual solution consists in disposing a current transformer in each of the phases of the three phase network, or possibly in two of the three phases.

However, this signal may also be taken, in a particularly advantageous way, by means of a single current transformer in accordance with the process and device described in French Patent Application No. 84 04635 filed in the name of the Applicant.

This current measuring process comprises more particularly the following steps:

- the measurement, on the alternating side, of the difference between the currents flowing in two of the supply phases,
- determination of the absolute value of this difference, and,
- attribution to the absolute value of the resulting signal of a coefficient k so as to obtain an output signal which forms a continuous image of the current delivered by the rectifier bridge.

More precisely, to the correction coefficient is attributed a value $k_1$ in the parts $T/6$ of each period $T$ of the alternating current of the network where the signal has a doubled absolute value and a value $k_2 = 2k_1$ in the remaining parts of each period.

Thus, in the process for determining the mean value of the current delivered by the rectifier bridge, these correction coefficients may be advantageously obtained by a corresponding variation of the gain of the synchronous integrator used. It is clear that switching from gain $k_1$ to gain $k_2 = 2k_1$ must be provided synchronously with control of the thyristors of the power bridge.

BRIEF DESCRIPTION OF THE DRAWINGS

Some embodiments of the invention will be described hereafter, by way of non limitative examples, with reference to the accompanying drawings in which:

FIG. 3a is a diagram for illustrating the sequencing of the operations effected for controlling the thyristors of the bridge from a synchronization signal, FIG. 3b is a diagram showing the form of the current delivered by the bridge, FIG. 3c is a diagram representative of the output voltage of the synchronous integrator.

DESCRIPTION OF THE PREFERRED EMBODIMENTS

Figure 1:
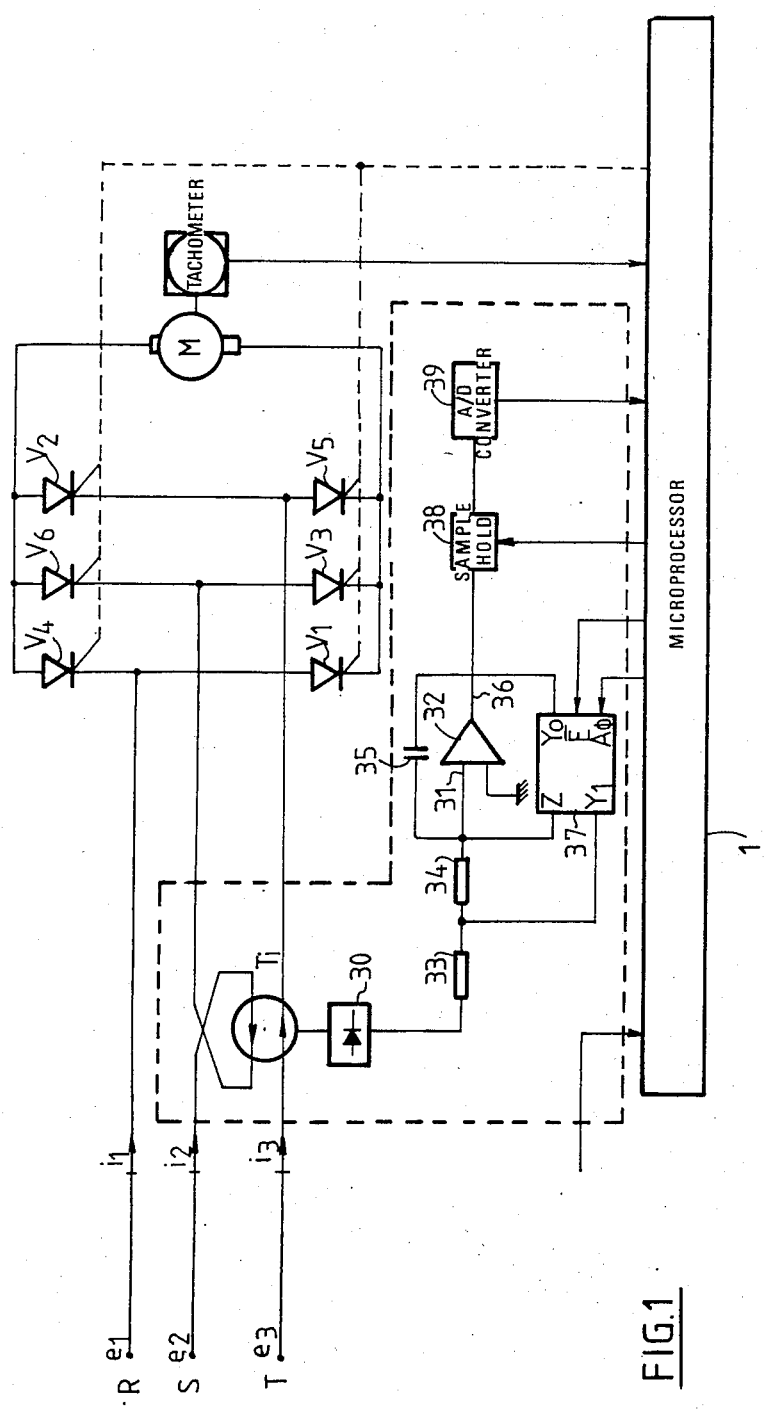
FIG. 1 is a partial schematical representation of an electronic speed variator for a DC motor using a device for determining the mean value of the current delivered by the rectifier bridge, in accordance with the present invention.

The speed variator shown in FIG. 1 is fed with the alternating current of a three-phase network whose three phase conductors RST present phase voltages $e_1$, $e_2$, $e_3$ and have currents $i_1$, $i_2$, $i_3$ flowing therethrough.

This speed variator comprises a thyristor power bridge of the Graetz circuit type, formed by three thyristor pairs $V_1$-$V_4$, $V_3$-$V_6$, $V_5$-$V_2$. The output of this power bridge is connected to a DC motor M.

The principle of a Graetz circuit is well known and will therefore not be described in detail. It should however be recalled that the voltage at the terminals of the three phase network is broken down into six compound voltages, ($e_1$-$e_3$), $e_2$-$e_3$), ($e_2$-$e_1$), ($e_3$-$e_1$), $e_3$-$e_2$) and ($e_1$-$e_2$). All these compound voltages are shifted with respect to each other by 60°, so that the period of the voltage of the network is thus broken down into six 60° zones (period T/6) defined by the zero cross-over times of these six compound voltages. To each of these zones there corresponds a period of conduction of a given thyristor pair of the bridge. The variation of the mean voltage delivered by the bridge may therefore be regulated by varying the phase shift angle $\phi$ with respect to the rectifier positive cross-over points. The switching control for the thyristors of the bridge may therefore be provided from the determination of the following parameters:

the zero cross-over times of the compound voltages of the network, the direction of rotation of the phase voltages $e_1$, $e_2$, $e_3$ of the RST network which allows the sequential order of the conduction periods of the thyristors to be defined, and the phase shift angle $\phi$, Sequencing of the operations effected for controlling the thyristors $V_1$ $V_6$ of the bridge is provided by a microprocessor 1 in the way illustrated by the diagram shown in FIG. 3a.

As can be seen in this diagram, to each of the zones of period T/6 of the phase voltages of the network, which are defined by the synchronization times $t_1$, $t_2$, $t_3$..., there corresponds, with a given striking angle $\theta_1$, $\theta_2$, $\theta_3$... the striking of a thyristor pair of the bridge. The current supplied by this latter is then in the form of a succession of arcs of curves (FIG. 3b) passing from one to the other at times $t_1+\theta_1$, $t_2+\theta_2$, $t_3+\theta_3$...

We saw above that the striking angles $\theta_1$, $\theta_2$, $\theta_3$... were elaborated by the regulation system (associated with the microprocessor 1) and consequently required calculation of the mean value of the current delivered by the bridge. To avoid the delays which conventional filtering systems suffer from, the invention proposes using a synchronous integrator for calculating, in digital form, the mean value of the current for each of the zones of period (T/6), in the time which precedes the determination of the switching on angle of a thyristor. Thus, an operating sequence ordered by the microprocessor 1 will comprise the following steps, starting from time $t_1$ shown in FIG. 3c:

at time $t_1$, the beginning of downcounting of a counter previously loaded to a value corresponding to a striking angle $\theta_1$, when the counter arrives at zero, switching on of a corresponding thyristor pair of the bridge (the current begins a new arc of a curve), arrival at time $t'_1$ of the synchronous integrator at the end of its integration period ( this latter having a value of T/6 and a phase shift with respect to the synchronization signal), measurement of the value supplied by the integrator at the end of its integration period $t'_1$, then resetting of this integrator which then begins a new integration cycle;

calculation of a striking angle $\theta_2$ as a function of the previously measured mean value of the current and loading the counter as a function of the value of this striking angle;

triggering of the downcounting of the counter at time $t_2$ and starting up of a new sequence.

Figure 2:
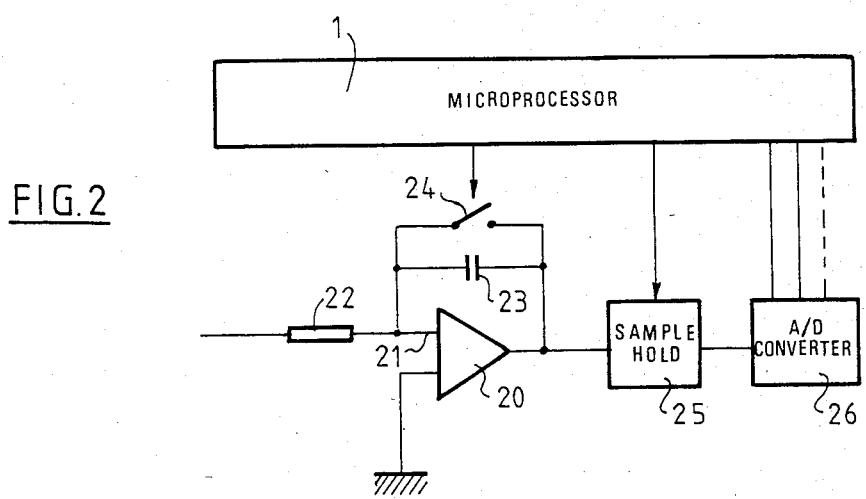
FIG. 2 is a general diagram of a variant of a circuit for determining the mean value of the current delivered by the thyristor bridge used in the speed variator shown partially in FIG. 1.

The integration circuit used for calculating the mean value of the current supplied by the rectifier bridge may have a structure such as that shown in FIG. 2.

This circuit comprises a synchronous integrator formed by an operational amplifier 20 whose inverting input 21 receives through a resistor 22 a signal representative of the current supplied by the rectifier bridge $V_1$ to $V_6$ and is connected to its output by a capacitor 23. This capacitor 23 may be short-circuited for resetting the integrator by means of a switch 24 driven by the microprocessor 1. This latter is adapted for discharging the capacitor at the above defined times $t'_1$, $t'_2$...

The output of this integrator is moreover connected to the input of a blocking sampler 25 driven by the microprocessor 1 and itself connected to an analog-digital converter 26. Sampler 25 is adapted for sampling the output voltage of the integrator at the time suceeding resetting thereof by switch 24 and for transmitting this value to the analog-digital converter 26 which may then supply to microprocessor 1 a digital signal representative of the mean value of the current during the period elapsed with a view to determining a new striking angle.

This circuit, in which the gain of the synchronous integrator is constant and is determined by resistor 22, may be used in the case where a signal such as the one shown in FIG. 3b is available, which is an image of the current delivered by the rectifier bridge.

The invention also provides a solution for obtaining this mean value of the current from the current taken by a single current transformer Ti associated with two phase conductors S,T of the network supplying the rectifier bridge. This solution is illustrated by the circuit shown in the block surrounded by a broken line in FIG. 1.

In this circuit, the single current transformer Ti is associated with the phase conductors S and T, conductor S being looped so that the signal available at the secondary of the transformer Ti is representative of the difference $i_{3-i2}$.

The secondary of transformer Ti is connected to the terminals of a single full wave rectifier 30 whose output is connected to the inverting input 31 of an operational amplifier 32 through two series resistors 33,34 of the same value.

This operational amplifier 32 is connected as a synchronous integrator and comprises a capacitor 35 connected between its inverting input 31 and its output 36.

This capacitor 35 is moreover shunted by a switching circuit 37 driven by microprocessor 1. In addition, as will be explained further on, this switching circuit 37 is also adapted for short-circuiting the resistor 34 at the request of the micrprocessor 1, so as to be able to cause the gain of the integrator to pass alternately from a value k to a value 2k.

Similarly to the previously described circuit, this synchronous integrator is connected by its output to a blocking sampler 38 driven by microprocessor 1, whose output is connected to the input of an analog-digital converter 39. This A-D converter delivers to microprocessor 1 a digital signal representative of the mean current detected.

Figure 4A:
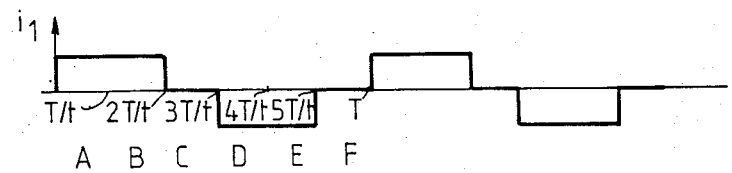
FIGS. 4a to 4e show the simplified timing diagrams of the different currents flowing in the circuit for determining the mean value of the current delivered in the thyristor bridge used in the speed variator shown in FIG. 1.
Figure 4B:
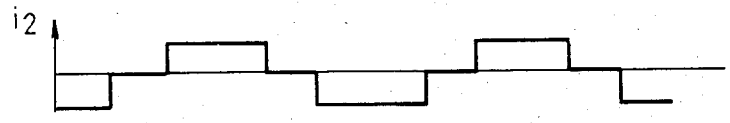
Figure 4C:
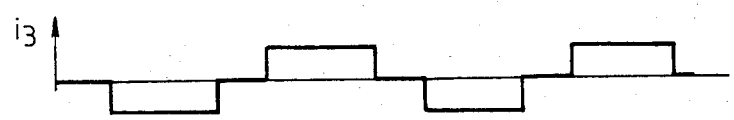

The currents $i_1$, $i_2$, $i_3$ flowing in the phase conductors R,S,T have, as a function of time, a form schematized by the square waves shown in FIGS. 4a, 4b, 4c (which corresponds to a constant current in the load).

Figure 4D:
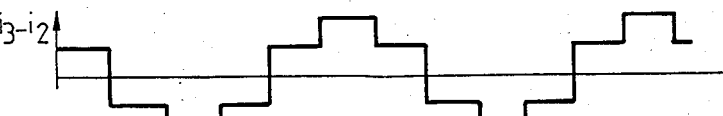
Figure 4E:
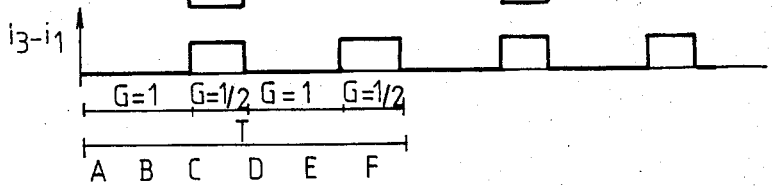

The current transformer Ti produces at its secondary the square wave illustrated in FIG. 4d and the rectifier delivers at its output the wave shown in FIG. 4e. The switching circuit 37 alternately short circuits the resistor 34 so as to cause the gain of the integrator to pass from a value k/2 (resistor 34 not short-circuited) to a value k (resistor 34 short-circuited). More precisely, the value k/2 is attributed for the intervals C and F of each period T (FIGS. 4a and 4e) of the current of the network, for correcting the signal $i_{3-i2}$ whose value is, in these intervals, double the value to be measured. The value k of the gain is attributed in the intervals A,B,D,E of each period T.

The switching circuit shown in FIG. 1 comprises two control inputs $A_0$ and $\overline{E}$ connected to the microprocessor 1, a terminal $Y_0$ connected to the output 36 of the operational amplifier 32, a terminal Z connected to the inverting input 31 of the operational amplifier 32 and a terminal $Y_1$ connected to the junction point between resistors 33 and 34. Its operation is as follows:

when the input $\overline{E}$ is at logic level 1 and input $A_0$ is at a floating potential, the terminals $Y_1$ and Z are connected electrically so that we have a gain of value k/2;

when the two inputs $\overline{E}$ and $A_0$ are at logic level 0, the terminals Z and $Y_0$ are electrically connected so that capacitor 35 is short-circuited (resetting of the integrator), and when the input $\overline{E}$ is at logic level 0 and input $A_0$ is at logic level 1, terminals Z and $Y_1$ are connected electrically so that a gain of value k is obtained.

What is claimed is:

1. A device for determining the mean value of the current delivered by a controlled valve rectifier bridge fed by a three phase network having first and second and third phase conductors having phase voltages each having a period zone, said first phase conductor having a looped part and said device comprising a current transformer having a primary circuit coupled with said looped part and with said second phase conductor and a secondary circuit which produces a signal representative of the difference between the currents flowing through said first and said second phase conductors, a single full wave rectifier having an input which receives said signal and an output connected to a first resistor, a second resistor serially mounted with said first resistor through a junction point and connected to an integrating assembly formed by an operational amplifier having an integrating input connected to said second resistor and an output connected to said integrating input by a capacitor and by a switching device, one particular of said two resistors having two terminals which are connected to said switching device, a microprocessor adapted for controlling said switching device so as to obtain successive integration cycles of duration equal to the period zones of the phase voltages of the network but phase shifted with respect thereto, for resetting said integrator assembly at the end of each cycle and by short-circuiting said particular resistor to cause the gain of the operational amplifier to pass alternately from a first value to a second value, a sample hold circuit connected to the output of the operational amplifier and controlled by the microprocessor so as to produce sampling at the end of each integration cycle in a time preceeding said resetting, said sample hold circuit having an output connected to an analog digital converter.

2. The device as claimed in claim 1, wherein said switching device comprises at least a first and a second control input, a first terminal connected to the output of the operational amplifier, a second terminal connected to said integrating input of the operational amplifier, a third terminal connected to the junction point between said resistors, means for disconnecting said second and said third terminals when the first input is at level 1 and the second input is at a floating potential, means for electrically connecting the first and the second terminals when said first and second inputs are at level 0, and means for electrically connecting the second and third terminals when the first input is at level 0 and the second input is at level 1.

* * * * *